(12) United States Patent
Hirano et al.

(10) Patent No.: US 7,598,570 B2
(45) Date of Patent: Oct. 6, 2009

(54) SEMICONDUCTOR DEVICE, SRAM AND MANUFACTURING METHOD OF SEMICONDUCTOR DEVICE

(75) Inventors: Yuuichi Hirano, Tokyo (JP); Takashi Ipposhi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 389 days.

(21) Appl. No.: 11/250,382

(22) Filed: Oct. 17, 2005

(65) Prior Publication Data
US 2006/0086980 A1    Apr. 27, 2006

(30) Foreign Application Priority Data
Oct. 22, 2004    (JP)    ............... 2004-308029

(51) Int. Cl.
*H01L 27/11*    (2006.01)
(52) U.S. Cl. ............ 257/349; 257/202; 257/206; 257/347; 257/351; 257/E27.098
(58) Field of Classification Search ............ 257/349, 257/351, 903
See application file for complete search history.

(56) References Cited

U.S. PATENT DOCUMENTS 6,787,855 B2 * 9/2004 Hirano et al. ............ 257/351
7,271,454 B2 * 9/2007 Hirano et al. ............ 257/379
2002/0112137 A1 * 8/2002 Houston ............ 711/200

OTHER PUBLICATIONS

Mukesh Khare, et al., "A High Performance 90nm SOI Technology with 0.992 µm²6T-SRAM Cell", 2002 IEEE.
Y. Hirano, et al., "Bulk-Layout-Compatible 0.18 µm SOI-CMOS Technology Using Body-Fixed Partial Trench Isolation (PTI)", 1999 IEEE International SOI Conference, Oct. 1999, pp. 131-132.

* cited by examiner

*Primary Examiner*—Kenneth A Parker
*Assistant Examiner*—Jose R Diaz
(74) *Attorney, Agent, or Firm*—Oblon, Spivak, McCellland, Maier & Neustadt, L.L.P.

(57) ABSTRACT

A semiconductor device according to the present invention is provided with an SOI substrate, an active region, a first insulating film (complete separation insulating film), a second insulating film (partial separation insulating film), and a contact portion. Here, the active region is formed within the surface of the SOI layer. In addition, the first insulating film is formed on one side of the active region from the surface of SOI layer to the buried insulating film. In addition, the second insulating film is formed on the other side of the active region from the surface of SOI layer to a predetermined depth that does not reach the buried insulating film. In addition, the contact portion is provided toward the side where the first insulating film exists, off the center of the active region in a plan view.

7 Claims, 16 Drawing Sheets

SEMICONDUCTOR DEVICE, SRAM AND MANUFACTURING METHOD OF SEMICONDUCTOR DEVICE

BACKGROUND OF THE INVENTION

1. Field of the Invention

This invention relates to a semiconductor device, an SRAM and a manufacturing method of a semiconductor device. In particular, this invention relates to a semiconductor device which has an active region and a contact portion connected to the active region, an SRAM and a manufacturing method of a semiconductor device.

2. Description of the Background Art

Technologies for forming a transistor on an SOI substrate have existed conventionally (see "Bulk-Layout-Compatible 0.18 µm SOI-CMOS Technology Using Body-Fixed Partial Trench Isolation (PTI)," 1999 IEEE International SOI Conference, October 1999, pp. 131-132, by Y Hirano et. al.).

An active region that forms a transistor is surrounded by a partial separation insulating film according to the invention of the aforementioned literature. Here, a contact portion is connected to the active region.

In the step of connecting the contact portion to the active region, however, the contact portion is formed in a position that is shifted from the original active region due to shifting during overlapping.

In accordance with the miniaturization of semiconductor devices, the width of active regions tends to be scaled down. When the width of an active region is scaled down, however, the possibility of a contact portion being formed outside of the active region due to shifting during overlapping, as described above, becomes high.

In the case where a contact portion is formed outside of the active region, a portion of the contact portion is connected to the body portion within the SOI layer. As a result of this, a leak current is caused between the contact portion and the body portion.

It is necessary to provide a contact portion on a narrow active region with high precision, in order to prevent the occurrence of such a leak current. This has become a factor in making the manufacture of semiconductor devices difficult.

SUMMARY OF THE INVENTION

An object of this invention is to provide a semiconductor device where a process for providing a conductor to a narrow active region can be easily carried out, an SRAM and a manufacturing method of a semiconductor device.

According to the first aspect of the present invention, a semiconductor device is provided with an SOI substrate, an active region, a first insulating film, a second insulating film and a conductor. Here, the SOI substrate has a structure where a semiconductor support substrate, a buried insulating film and an SOI layer are layered in this order. The active region is formed in the surface of the SOI layer. The first insulating film is formed on one side of the active region from the surface of the SOI layer to the buried insulating film. The second insulating film is formed on the other side of the active region, which is opposite to this side from the surface of the SOI layer to a predetermined depth which does not reach the buried insulating film. The conductor is provided on the active region, toward the side where the first insulating film exists, off the center of the active region in a plan view.

It becomes easy to provide a contact on a narrow active region. That is, even in the case where a conductor is provided to a portion that is shifted to the first insulating film side, no contact is made with the body. In addition, even in the case where the conductor is provided to a portion that is shifted to the second insulating film side, the conductor is not provided within the second insulating film, because the contact margin on the second insulating film side is wide on the active region. As described above, a slight shift can be tolerated when providing a conductor, and therefore, it becomes easy to provide a conductor on a narrow active region.

According to the second aspect of the present invention, an SRAM is provided with an SOI substrate, an access transistor, a first insulating film, a second insulating film and a first conductor. Here, the SOI substrate has a structure where a semiconductor support substrate, a buried insulating film and an SOI layer are layered in this order. The access transistor has a first active region that is formed within the surface of the SOI layer, and is formed in the SOI layer. The first insulating film is formed on one side of the first active region from the surface of the SOI layer to the above described buried insulating film. The second insulating film is formed on the other side of the first active region, which is opposite to this side, from the surface of the SOI layer to a predetermined depth that does not reach the buried insulating film. The first conductor is provided on the first active region, toward the side where the first insulating film exists, off the center of the first active region in a plan view.

It becomes easy to provide a contact on a narrow active region. That is, even in the case where a conductor is provided to a portion that is shifted to the first insulating film side, no contact is made with the body. In addition, even in the case where the conductor is provided to a portion that is shifted to the second insulating film side, the conductor is not provided within the second insulating film, because the contact margin on the second insulating film side is wide on the active region. As described above, a slight shift can be tolerated when providing a conductor, and therefore, it becomes easy to provide a conductor on a narrow active region.

According to the third aspect of the present invention, a manufacturing method of a semiconductor device is provided with steps (a) to (e). The step (a) is a step of preparing an SOI substrate which has a structure where a semiconductor support substrate, a buried insulating film and an SOI layer are layered in this order. The step (b) is a step of forming an active region in the surface of the SOI layer. The step (c) is a step of forming a first insulating film on one side of the active region from the surface of the SOI layer to the buried insulating film. The step (d) is a step of forming a second insulating film on the other side of the active region which is opposite to this side, from the surface of the SOI layer to a predetermined depth that does not reach the buried insulating film. The step (e) is a step of providing a conductor, if possible, on the active region toward the side where the first insulating film exists, off the center of the active region in a plan view.

A semiconductor device where a conductor and a body portion do not make contact can be easily provided. Accordingly, the number of defects where a leak current is caused between a conductor and a body portion can be reduced, and the cost of manufacture can be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

In the following, this invention is concretely described in reference to the figures showing the embodiments thereof.

First Embodiment

Structure

Figure 1:
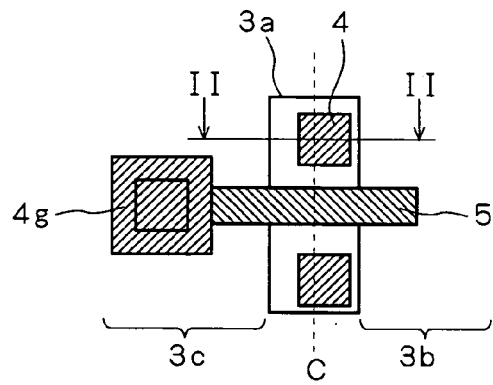
FIG. 1 is a plan view showing the configuration of a semiconductor device according to the first embodiment.

FIG. 1 is a plan view showing the configuration of a semiconductor device (transistor) according to the present first embodiment. In addition, FIG. 2 is a cross-sectional view showing the configuration along line II-II of FIG. 1.

Figure 2:
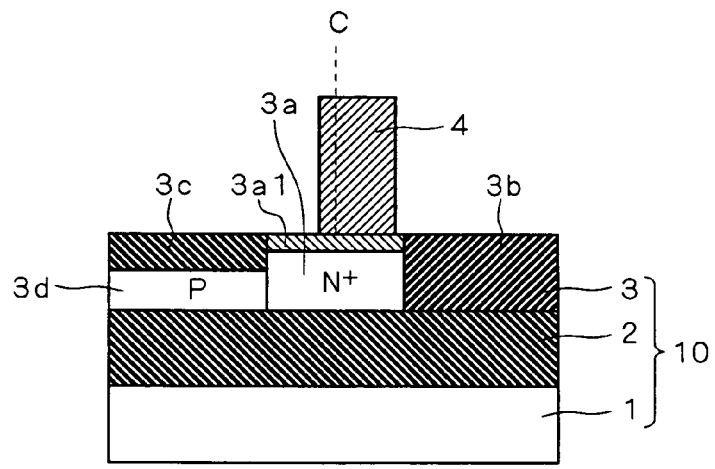
FIG. 2 is a cross-sectional view showing the configuration of the semiconductor device according to the first embodiment.

As shown in FIGS. 1 and 2, a transistor is formed on an SOI (semiconductor on insulator) substrate 10. Here, the SOI substrate 10 is formed of a semiconductor support substrate 1, a buried insulating film 2 and an SOI layer 3.

Concretely speaking, as shown in FIG. 2, the buried insulating film 2 is formed on the semiconductor support substrate 1. In addition, the SOI layer 3 is formed on the buried insulating film 2.

An N+ type active region 3a is formed within the surface of the SOI layer 3. Here, as shown in FIG. 2, the active region 3a is formed from the surface of the SOI layer 3 and reaches the buried insulating film 2. Here, a silicide film 3a1, such as a cobalt silicide film, is formed in the upper surface portion of the active region. Hereinafter, this is referred to as the active region 3a, including the silicide film 3a1 (in FIG. 1, the silicide film 3a1 is omitted).

In addition, a complete separation insulating film (which can be construed as a first insulating film) 3b and a partial separation insulating film (which can be construed as a second insulating film) 3c, which separate the shown transistor from other semiconductor elements (not shown) are formed in the SOI layer 3.

As shown in FIGS. 1 and 2, the complete separation insulating film 3b is formed so as to make contact with one side of the active region 3a. In addition, as shown in FIG. 2, the complete separation insulating film 3b is formed from the surface of the SOI layer 3 to the buried insulating film 2.

In addition, as shown in FIGS. 1 and 2, the partial separation insulating film 3c is formed so as to make contact with a portion of the other side of this active region 3a, which is opposite to this side of the active region 3a. In addition, as shown in FIG. 2, the partial separation insulating film 3c is formed from the surface of the SOI layer 3 to a predetermined depth (depth that does not reach the buried insulating film 2).

Here, as shown in FIG. 2, a P type body region 3d is formed between the lower surface of the partial separation insulating film 3c and the upper surface of the buried insulating film 2. Here, at the time of the operation, the body region 3d is fixed at a predetermined potential.

In addition, as shown in FIGS. 1 and 2, a contact portion 4 is connected to the upper surface of the active region 3a. Here, the contact portion 4 is provided toward the complete separation insulating film 3b side, off the center (dotted line C in the figure) of the active region.

Furthermore, as shown in FIG. 1, a gate electrode 5 is provided on the SOI layer 3. Thus, the gate electrode 5 and the active region 3a form the transistor.

The semiconductor device according to this embodiment is formed as described above; therefore, has the below described effects. First, before describing the effects, a problem in the semiconductor device (transistor) having the following structure is described.

Figure 3:
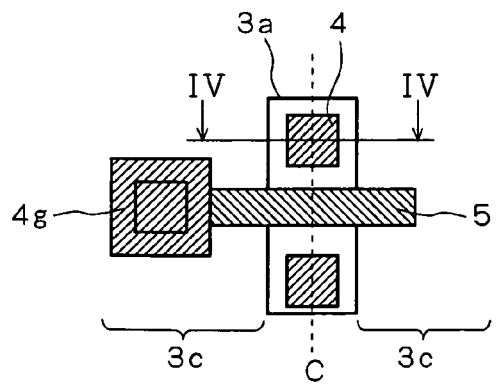
FIG. 3 is a plan view showing the configuration of a semiconductor device having a problem.

FIG. 3 is a plan view showing the configuration of the semiconductor device (transistor) which has a problem. In addition, FIG. 4 is a cross-sectional view showing the configuration along line IV-IV of FIG. 3.

Figure 4:
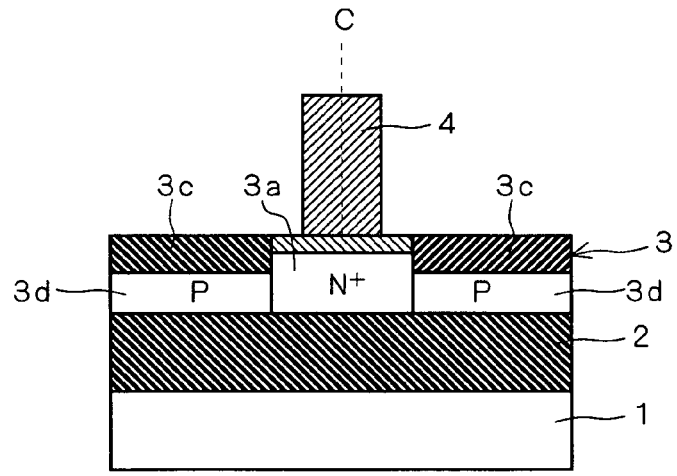
FIG. 4 is a cross-sectional view showing the configuration of the semiconductor device having a problem.

As shown in FIGS. 3 and 4, partial separation insulating films 3c are formed within an SOI layer 3, on both sides of an active region 3a. Thus, as shown in FIG. 4, body regions 3d are respectively formed between the lower surface of the partial separation insulating films 3c and the upper surface of the buried insulating film 2.

In addition, a contact portion 4 is connected to the active region 3a. Here, the semiconductor device is designed in such a manner that the center of the contact portion 4 coincides with the center of the active region 3a (dotted line C in the figure).

When the contact portion 4 is actually provided, however, there is a possibility of the contact portion 4 being formed in a position that is shifted from the center of the active region 3a due to shifting during overlapping. In the case where the width of the active region 3a is sufficiently large in comparison with the diameter of the contact portion 4, the contact portion 4 is invariably provided on the active region 3a, even when a slight shift is caused during the provision of the contact portion 4.

Figure 5:
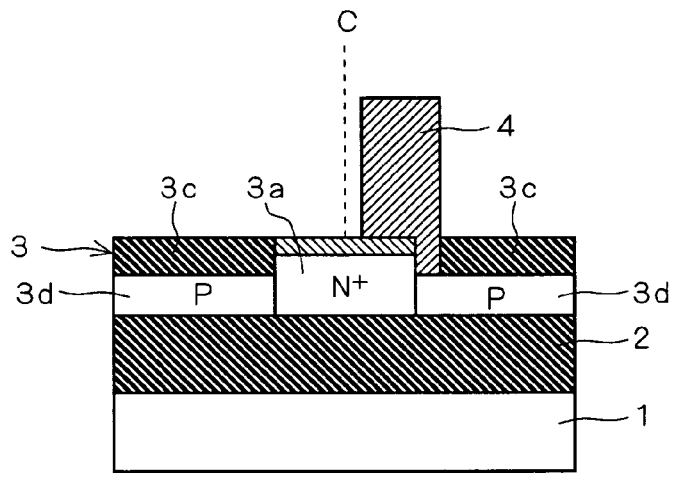
FIG. 5 is a cross-sectional view illustrating a problem in a semiconductor device.

However, it is assumed that shifting during overlapping is caused at the time of provision of a contact in the case where the width (b) of the active region 3a is no greater than twice the diameter (a) of the contact portion 4 ($b \leq 2a$). Then, as shown in FIG. 5, the contact portion 4 is formed outside of the active region 3a. Thus, this contact portion 4 is connected to a body region 3d, penetrating through a partial separation insulating film 3c.

When the contact portion 4 is connected to the body region 3d in this manner, a leak current is caused between the contact portion 4 and the body region 3d. In order to prevent this, it is necessary to provide the contact portion 4 only on the narrow active region 3a. Such a manufacturing process is extremely difficult.

By applying a semiconductor device according to this embodiment, however, a contact portion 4 can be easily provided to a narrow active region 3a.

That is, the contact portion 4 is provided, if possible, to a position on the active region 3a that is shifted toward the complete separation insulating film 3b side off the center of the active region 3a at the time of the provision of the contact portion 4 to the active region 3a.

Then, a large contact margin can be provided on the partial separation insulating film 3c side, on the active region 3a. In addition, it is assumed, as shown in FIGS. 6 and 7, that the contact portion 4 is formed outside of the active region 3a on the complete separation insulating film side, due to shifting during overlapping.

Only the complete separation insulating film 3b is formed in the direction of the shift; therefore, the contact portion 4 and the body portion 3d are not connected.

Figure 6:
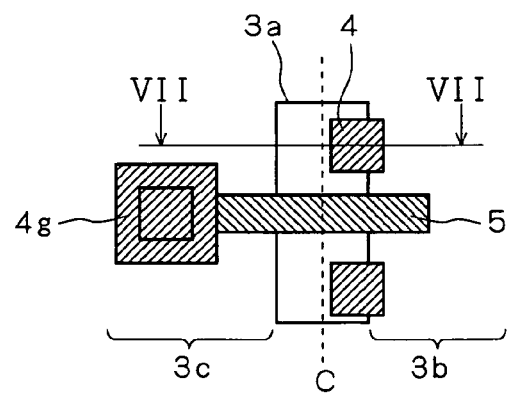
FIG. 6 is a plan view showing another configuration of the semiconductor device according to the first embodiment.
Figure 7:
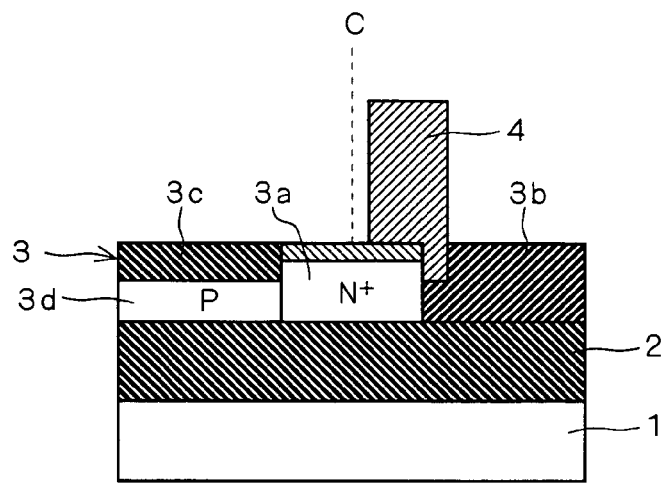
FIG. 7 is a cross-sectional view showing another configuration of the semiconductor device according to the first embodiment.

Here, FIG. 6 is a plan view showing a state where the contact portion 4 missed the active region, and FIG. 7 is a cross-sectional view showing the state along line VII-VII of FIG. 6.

As described above, when the structure of the semiconductor device according to this embodiment is adopted, it becomes unnecessary to strictly control the precision when the contact portion 4 is provided, and the process for providing the contact portion 4 becomes easier.

The present invention is particularly effective when the above described relationship b≦2a is gained.

Here, the object of this embodiment may include adopting the configuration shown in FIGS. 6 and 7 from the beginning, in addition to the structure shown in FIG. 2.

In the case where, as shown in FIGS. 6 and 7, the structure where the contact portion 4 misses the active region 3a and goes to the complete separation insulating film side is adopted, the process for providing the contact portion 4 naturally becomes easy, in the same manner as described above.

This is because a large contact margin can be gained on the partial separation insulating film 3c side on the active region 3a, in the same manner as described above, and in addition, even in the case where the contact portion 4 is provided so as to shift further to the complete separation insulating film 3b side from the position shown in FIGS. 6 and 7 due to shifting during overlapping, the contact portion 4 is not connected to the body portion 3d.

In addition, as is clear from the structure shown in FIG. 1, when the contact portion 4g that is to be connected to the gate electrode 5 is provided to the partial separation insulating film 3c side, then, the contact portion 4 is provided at a distance from this contact portion 4g. Accordingly, parasitic capacitance that is caused between the contact portion 4 and the contact portion 4g can be reduced.

Manufacturing Method

Next, a manufacturing method of the semiconductor device (transistor) shown in FIGS. 1 and 2 or FIGS. 6 and 7 is described.

Figure 8:
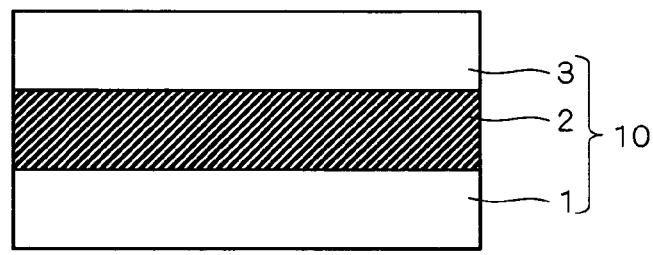
FIGS. 8 to 18 are cross-sectional views illustrating the steps in a manufacturing method of the semiconductor device according to the first embodiment.

First, as shown in FIG. 8, a buried insulating film 2 is deposited on a semiconductor support substrate 1 made of silicon or the like, and an SOI layer 3 is deposited on the buried insulating film 2, so that an SOI substrate 10 is prepared.

This SOI substrate 10 may be formed, for example, in accordance with an SIMOX (separation by implanted oxygen) method. In addition, the SOI substrate 10 may also be formed in accordance with a wafer adherence method.

Figure 9:
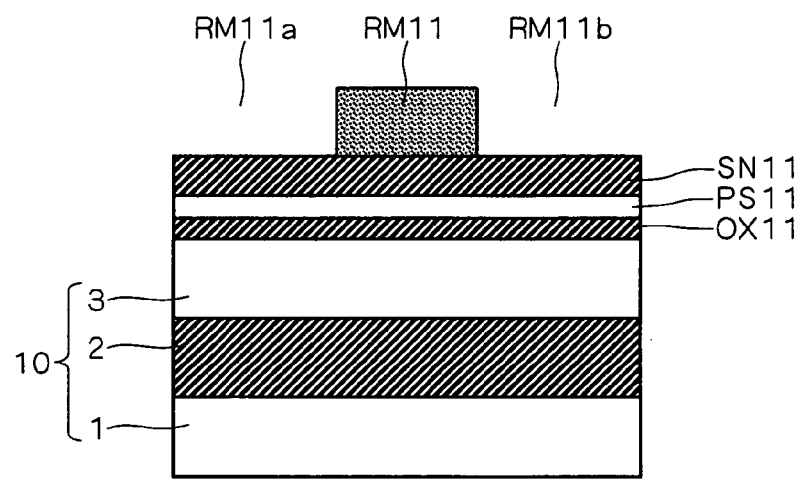

Next, as shown in FIG. 9, an oxide film OX11 is formed on the SOI layer 3 in accordance with a CVD method. Here, the film thickness of the formed oxide film OX11 is approximately 5 nm to 50 nm.

Next, as shown in FIG. 9, a polysilicon layer PS11 is formed on the oxide film OX11 in accordance with a CVD method. Here, the thickness of this polysilicon layer PS11 is approximately 10 nm to 100 nm.

Next, as shown in FIG. 9, a nitride film SN11 is formed on the polysilicon layer PS11 in accordance with a CVD method. Here, the film thickness of the nitride film SN11 is approximately 50 nm to 200 nm.

Subsequently, a resist mask RM11 is formed on the nitride film SN11 through patterning (FIG. 9). The resist mask RM 11 has a pattern where openings RM11a and RM11b correspond to the portions where a partial separation insulating film 3c and a complete separation insulating film 3b (FIGS. 1 and 2 or FIGS. 6 and 7) are provided.

Next, the nitride film SN11 is etched in accordance with the pattern of the resist mask RM11 with the openings. After that, the resist mask RM11 and the nitride film SN11 are utilized as an etching mask so as to carry out a dry etching process. As a result of this, the polysilicon layer PS11, the oxide film OX11 and the SOI layer 3 are partially removed in a selective manner.

Figure 10:
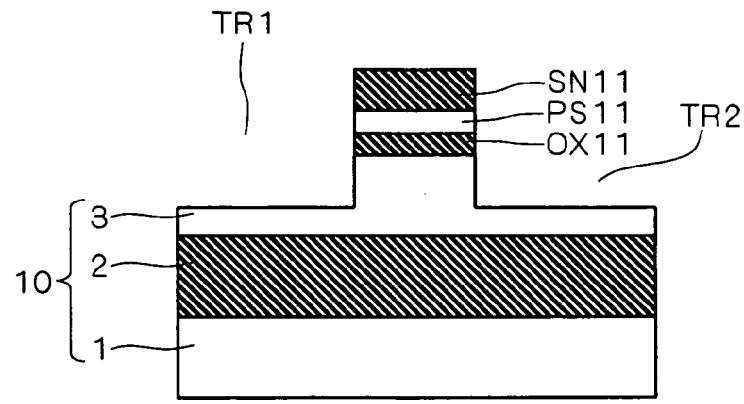

In the above described manner, as shown in FIG. 10, trenches TR1 and TR2 are formed so as to correspond to the places where the partial separation insulating film 3c and the complete separation insulating film 3b are formed. Here, in FIG. 10, the resist mask RM11 has been removed.

In addition, it is necessary for the etching of the SOI layer 3 not to penetrate through the SOI layer 3. Next, the nitride film SN11 is utilized as a mask and the surface of the exposed SOI layer 3 is thermally oxidized. As a result of this, an oxide film OX12 is formed on the surface of the exposed SOI layer 3.

Figure 11:
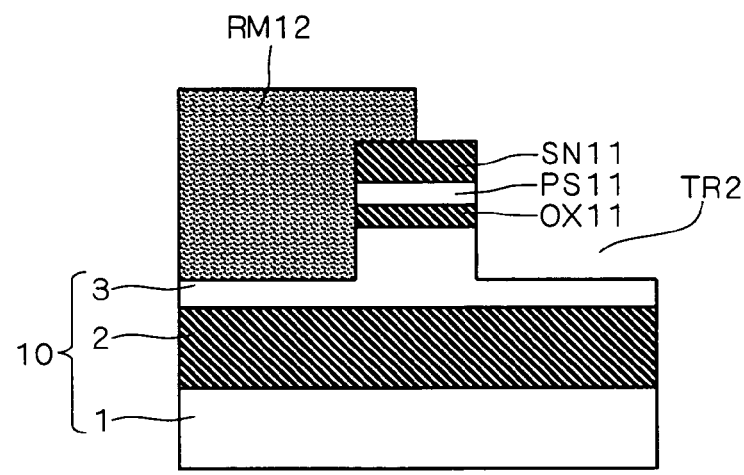

Next, as shown in FIG. 11, a resist mask RM12 is formed through patterning. The resist mask RM12 has a pattern where an opening only corresponds to the trench TR2 portion.

Figure 12:
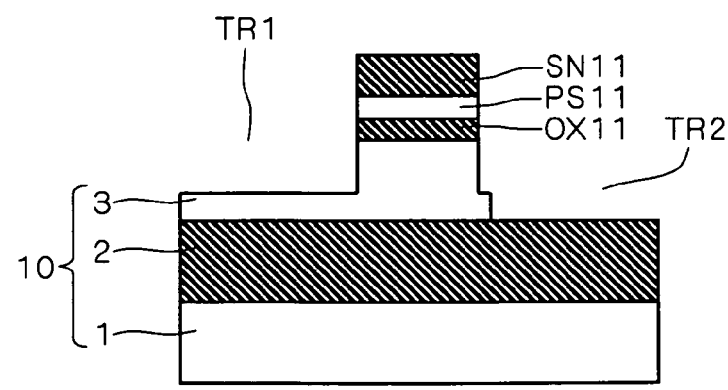

Next, the trench TR2 is further etched in accordance with the pattern of the resist mask RM12 with the opening. As a result of this, as shown in FIG. 12, the buried oxide film 2 is exposed from the bottom of the trench TR2 (a trench TR21 is formed). Here, in FIG. 12, the resist mask RM12 has been removed.

Figure 13:
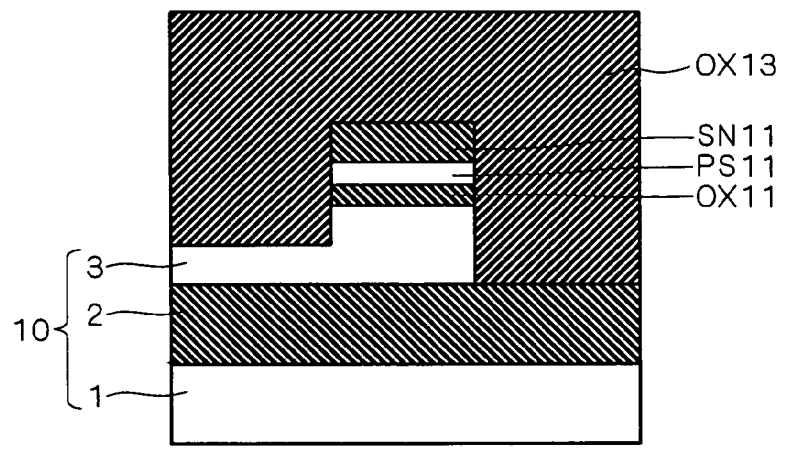

Next, as shown in FIG. 13, an oxide film OX13 is formed throughout the entirety of the SOI substrate 10 in accordance with a CVD method. The film thickness of this oxide film OX13 is approximately 300 nm to 600 nm. In addition, the oxide film OX13 completely fills in the inside of the trenches TR1 and TR21. Here, for the purpose of simplifying the figure, the oxide film OX12 is omitted.

Figure 14:
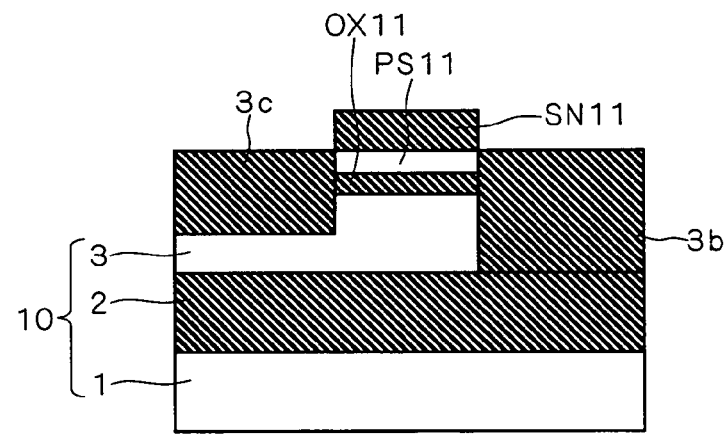

Next, a lithographic process, an etching process, a CMP, and the like are carried out on the SOI substrate 10 shown in FIG. 13. As a result of this, as shown in FIG. 14, the complete separation insulating film 3b and the partial separation insulating film 3c are formed.

Figure 15:
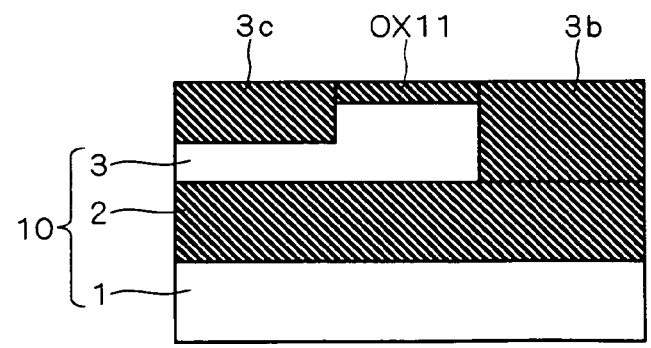

Next, as shown in FIG. 15, the nitride film SN11 and the polysilicon layer PS11 are removed through wet etching or dry etching.

Figure 16:
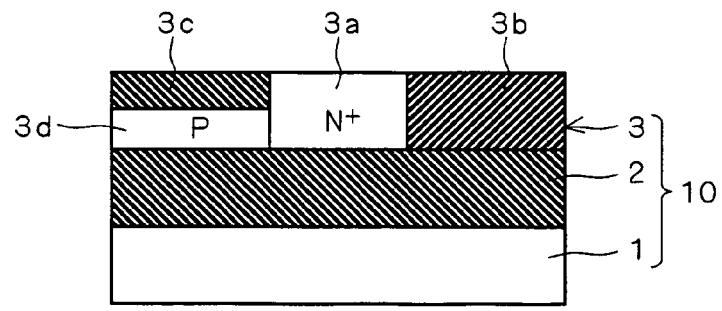

Next, impurity ions such as boron are implanted into a predetermined region, so that a P type body region 3d is formed in a predetermined region of the SOI layer 3 as shown in FIG. 16. Furthermore, a gate electrode (that includes a gate insulating film in which neither is shown) is formed after the oxide film OX11 has been removed. After that, this gate electrode is utilized as a mask and impurity ions such as phosphorous are implanted.

As a result of the above described process, as shown in FIG. 16, the P type body region 3d and an N+ type active region 3a are formed within the SOI layer 3.

Next, a process for the conversion to silicide is carried out on the upper surface of the active region 3a. As a result of this, a silicide film 3a1 such as a cobalt silicide film is formed within the surface of the active region 3a.

Figure 17:
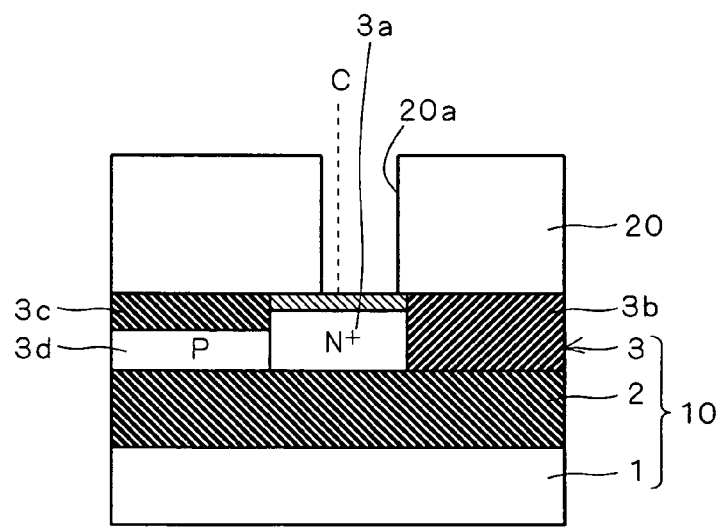
Figure 18:
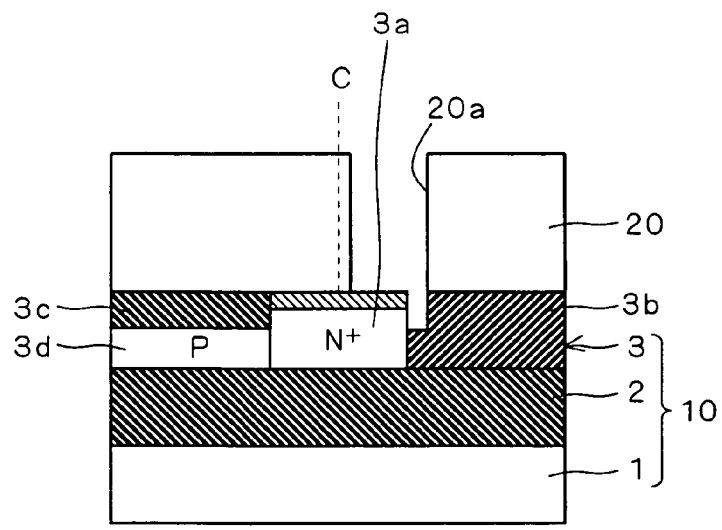

After that, as shown in FIG. 17 or 18, an interlayer insulating film 20 is formed on the SOI layer 3 in accordance with a CVD method or the like. Then, a lithographic process is carried out on the interlayer insulating film 20, so that a contact hole 20a is formed.

Here, this contact hole 20a is formed so that the center of the contact hole 20a, along its diameter, is positioned toward the complete separation insulating film 3b side, off the center C of the active region 3a. Here, in FIG. 18, the contact hole 20a is formed outside of the active region 3a and the complete separation insulating film 3b is partially over-etched.

Finally, the contact hole 20a shown in FIG. 17 or 18 is filled in with a conductor. As a result of this, the semiconductor device shown in FIGS. 1 and 2 or FIGS. 6 and 7 is completed. Here, in FIGS. 2 and 7, the interlayer insulating film 20 is omitted.

As described above, in accordance with a manufacturing method of a semiconductor device according to this embodiment, the complete separation insulating film 3b is formed on one side and the partial separation insulating film 3c is formed on the other side of the active region 3a which is formed in between within the surface of the SOI layer 3. Furthermore, the contact hole 20a is formed in the interlayer insulating film 20 so that the center of the contact hole 20a, along its diameter, is intentionally shifted towards the complete separation insulating film 3b side, off the center C of the active region 3a.

As a result of this, a margin for the formation of the contact hole 20a can be made large on the partial separation insulating film 3c side in the active region 3a. Accordingly, even in the case where shifting during overlapping occurs at the time of the formation of the contact hole 20a, the formation of the contact hole 20a on the partial separation insulating film 3c side can be prevented.

Accordingly, the connection of a contact portion 4 that is formed within this contact hole 20a to the body region 3d can be prevented; thus, a leak current can be prevented from being caused between the contact portion 4 and the body region 3d.

Second Embodiment

According to this embodiment, a semiconductor device (transistor) according to the first embodiment is applied to an SRAM (Static Random Access Memory).

Figure 19:
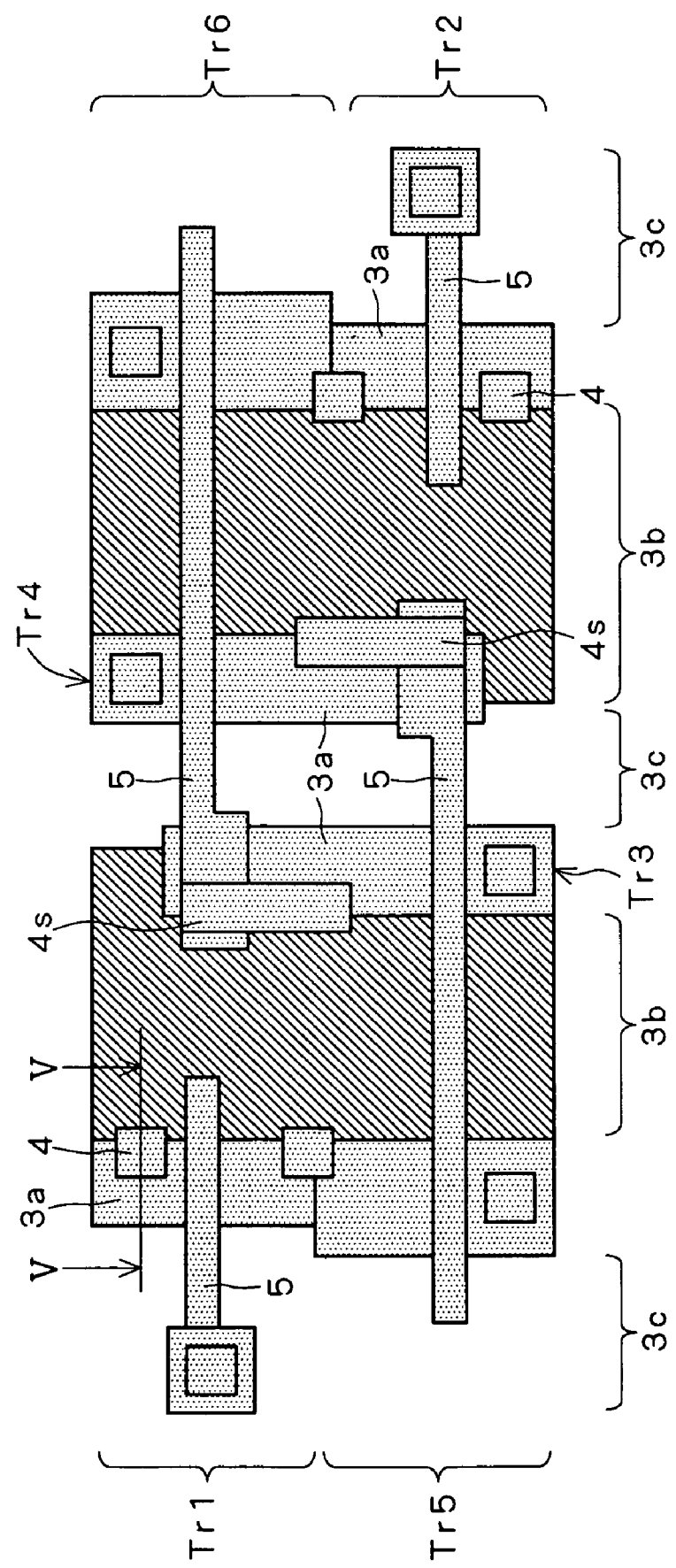
FIG. 19 is a plan view showing the configuration of an SRAM according to the second embodiment.
Figure 20:
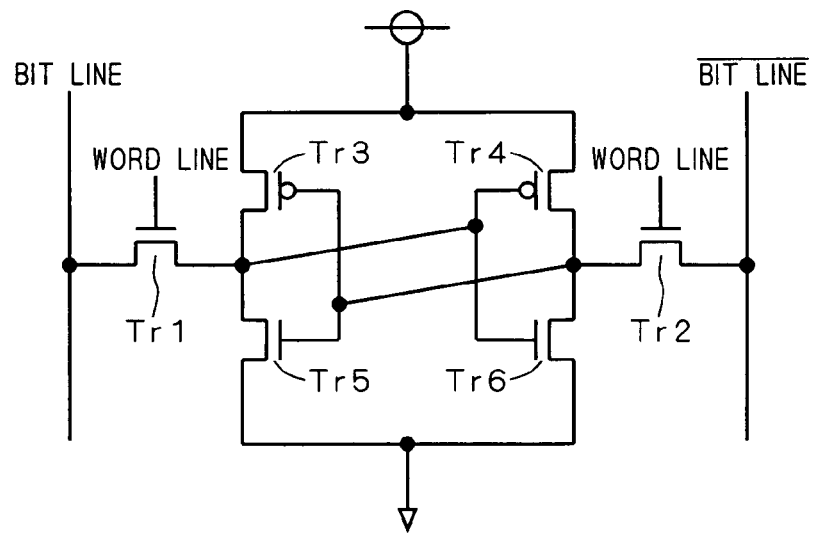
FIG. 20 is a circuit diagram showing the configuration of the SRAM according to the second embodiment.

FIG. 19 is a diagram showing, in a plan view, the structure of an SRAM to which a transistor according to the first embodiment is applied. FIG. 20 is a circuit diagram showing an equivalent circuit of the SRAM of FIG. 19. Here, the structure in the cross section along line V-V of FIG. 19 is the same as that shown in FIG. 7.

As shown in FIGS. 19 and 20, the SRAM is formed of access transistors Tr1 and Tr2, and load transistors Tr3 and Tr4, as well as driver transistors Tr5 and Tr6.

Here, the access transistors Tr1 and Tr2, as well as the driver transistors Tr5 and Tr6, are NMOS transistors, while the load transistors Tr3 and Tr4 are PMOS transistors.

As shown in FIG. 19, the SRAM formed within a predetermined region in an SOI layer 3 has a complete separation insulating film 3b and a partial separation insulating film 3c. Concretely, the complete separation insulating film 3b is formed on one side of each active region 3a, and the partial separation insulating film 3c is formed on the other side.

Here, the bodies that are directly beneath a gate electrodes 5 of the access transistors Tr1 and Tr2 are connected to body regions 3d that exist beneath the partial separation insulating films 3c. In addition, the potential of these bodies is fixed.

As shown in FIG. 19, contact portions 4 for the bit lines and the like that are provided above the active regions (sources/drains) 3a of the access transistors Tr1 and Tr2 exist toward the complete separation insulating film 3b side, off the center of the active regions 3a.

In addition, shared contact portions 4s also exist toward the complete separation insulating film 3b side, off the center of the active regions 3a of the load transistors Tr3 and Tr4. Here, the shared contacts 4s form nodes. In addition, the shared contacts 4s are provided so as to cross the gate electrodes 5 of the driver transistors Tr5, Tr6 and the like, as well as the active regions 3a of the load transistors Tr3 and Tr4.

As described above, the SRAM is formed by applying semiconductor devices (transistors) according to the first embodiment. Accordingly, in the same manner as in the first embodiment, the contact margins on the partial separation insulating film 3c sides can be made large in the active regions 3a at the time of the process for providing the contact portions 4 and the shared contact portions 4s.

Accordingly, the process for providing the contact portions 4 and the like can be carried out easily. In addition, the contact portions 4 and the like can be prevented from being connected to the body regions 3d (FIG. 5), and no leak current is caused between the contact portions 4 and the body regions 3d.

Here, the shared contact portions 4s are formed so as to be shifted to the partial separation insulating film side, so that the contact margin between the shared contact portions 4s and the gate electrodes 5 becomes small. In order to prevent this, the shared contact portions 4s in a form as that shown in FIGS. 21 and 22 may be formed.

Figure 21:
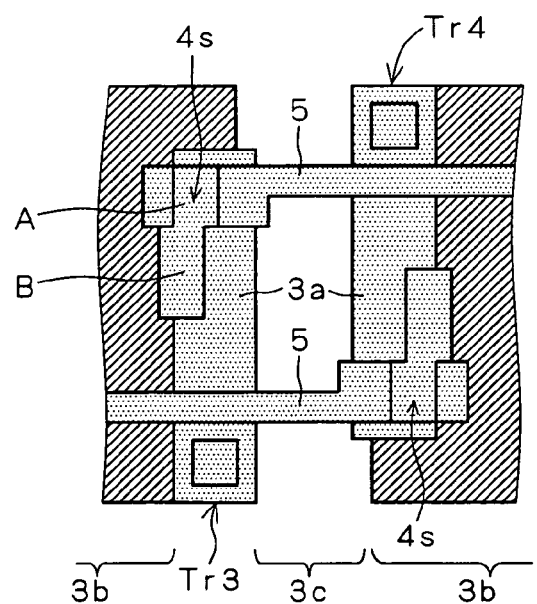
FIG. 21 is a plan view showing a portion of another configuration of the SRAM according to the second embodiment.

That is, as shown in FIG. 21, the shared contact portions 4s are categorized into two portions: portions A that make contact with the gate electrodes 5 of the shared contact portions 4s, and portions B that are connected to the active regions 3a of the shared contact portions 4s.

Thus, as shown in FIG. 21, portions B are provided toward the complete separation insulating film 3b side, as compared with portions A.

Figure 22:
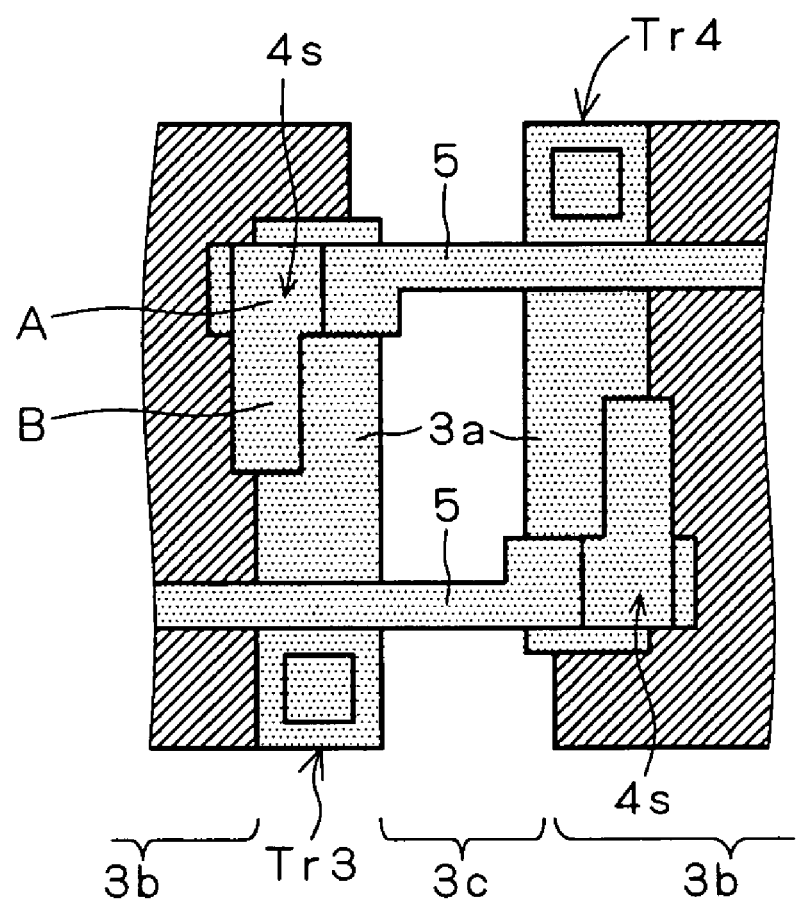
FIG. 22 is a plan view showing a portion of another configuration of the SRAM according to the second embodiment.

In addition, in FIG. 22, the width of portions A in the lateral direction in the figure is made greater than the width of portions B in the lateral direction in the figure.

Third Embodiment

Figure 23:
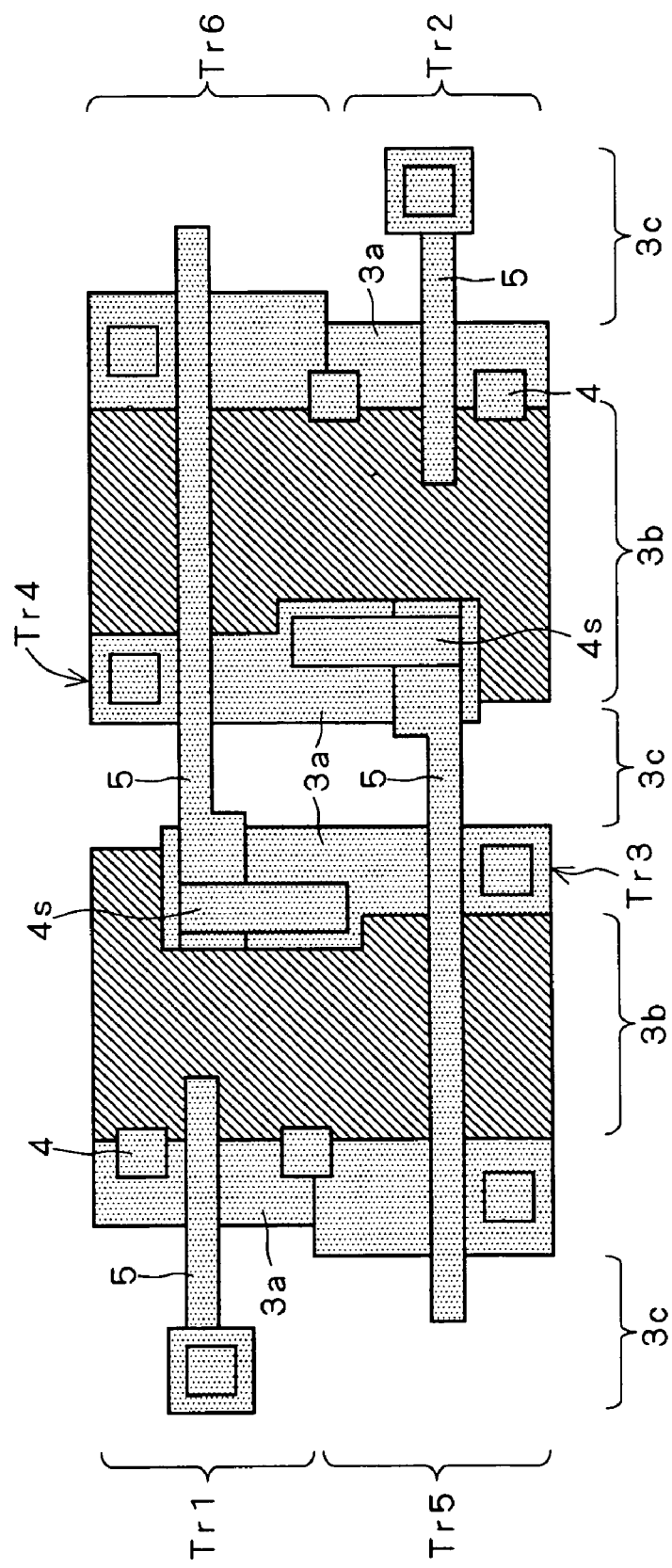
FIG. 23 is a plan view showing the configuration of an SRAM according to the third embodiment.
Figure 24:
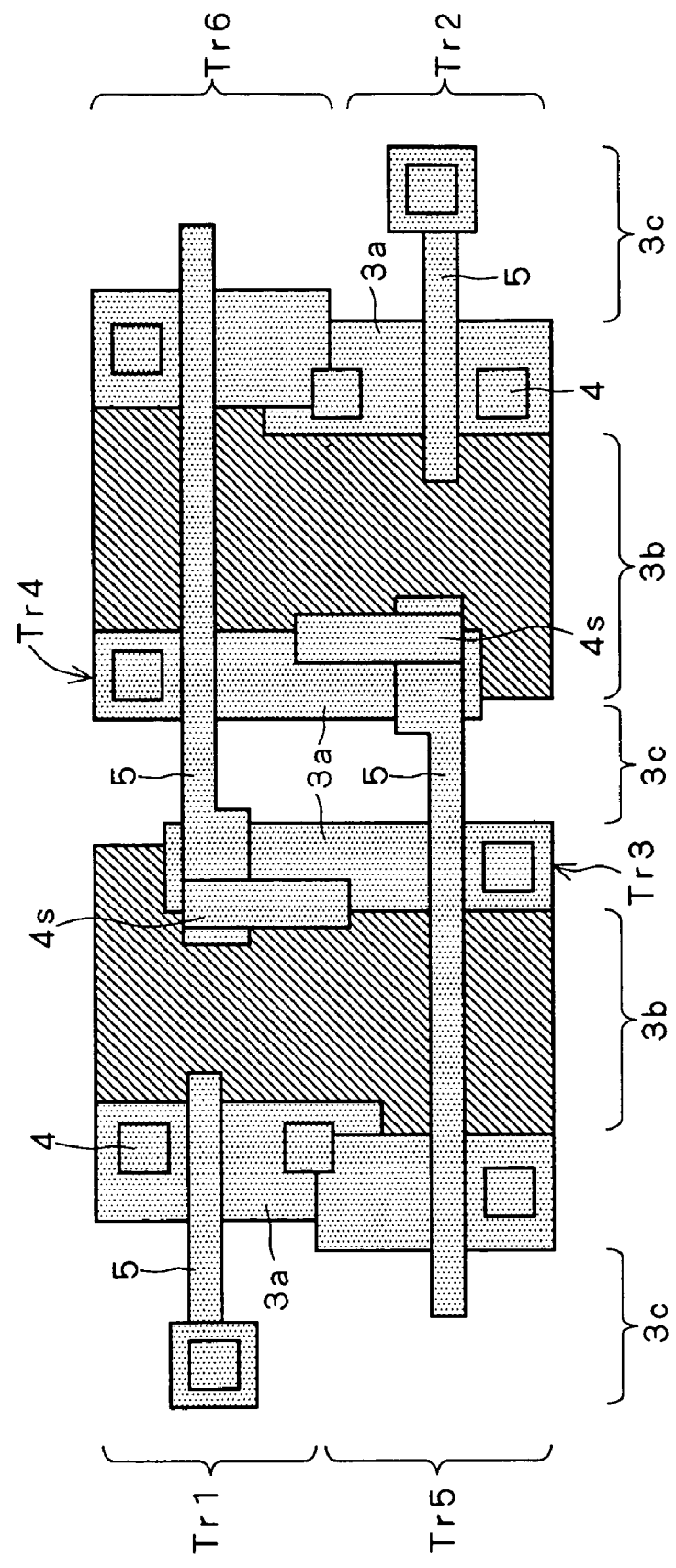
FIG. 24 is a plan view showing another configuration of the SRAM according to the third embodiment.
Figure 25:
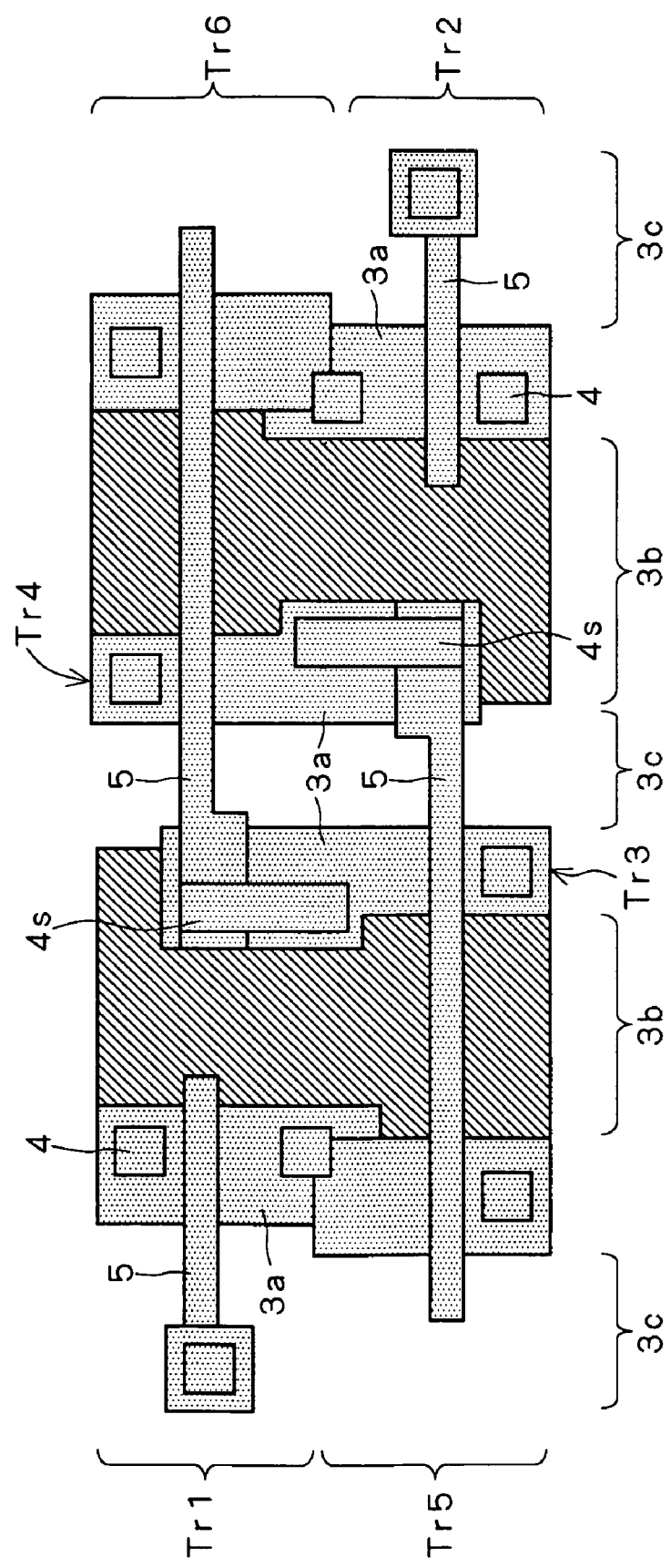
FIG. 25 is a plan view showing another configuration of the SRAM according to the third embodiment.

In this embodiment, other configurations where semiconductor devices (transistors) according to the first embodiment are applied to an SRAM are shown. FIGS. 23 to 25 are plan views showing the configurations according to this embodiment.

In the SRAMs shown in FIGS. 23 and 24, transistors having the configuration shown in FIG. 2 and transistors having the configuration shown in FIG. 7 both exist. In contrast, only transistors having the configuration shown in FIG. 2 are applied to the configuration shown in FIG. 25.

Concretely speaking, the configuration shown in FIG. 7 is applied to the configurations of the active regions 3a of the access transistors Tr1 and Tr2, as well as those of the contact portions 4 that are connected to these active regions 3a in FIG. 23. In addition, the configuration shown in FIG. 2 (configuration where the active region 3a is of a P+ type in the configuration of FIG. 2) is applied to the configurations of the active regions 3a of the load transistors Tr3 and Tr4, as well as those of the shared contact portions 4s that are connected to these active regions 3a.

In addition, the configuration shown in FIG. 2 is applied to the configurations of the active regions 3a of the access transistors Tr1 and Tr2, as well as those of the contact portions 4 that are connected to these active regions 3a in FIG. 24. In addition, the configuration shown in FIG. 7 (configuration where the active region 3a is of a P+ type in the configuration of FIG. 7) is applied to the configurations of the active regions 3a of the load transistors Tr3 and Tr4, as well as those of the shared contact portions 4s that are connected to these active regions 3a.

In addition, the configuration shown in FIG. 2 is applied to the configurations of the active regions 3a of the access transistors Tr1 and Tr2, as well as those of the contact portions 4 that are connected to these active regions 3a, and the configurations of the active regions 3a of the load transistors Tr3 and Tr4, as well as those of the shared contact portions 4s that are connected to these active regions 3a in FIG. 25. Here, the active regions of the load transistors Tr3 and Tr4 are of a P+ type.

The SRAMs according to this embodiment have the above described configurations, and therefore, the same effects as those described in the first embodiment can be gained.

Fourth Embodiment

Figure 26:
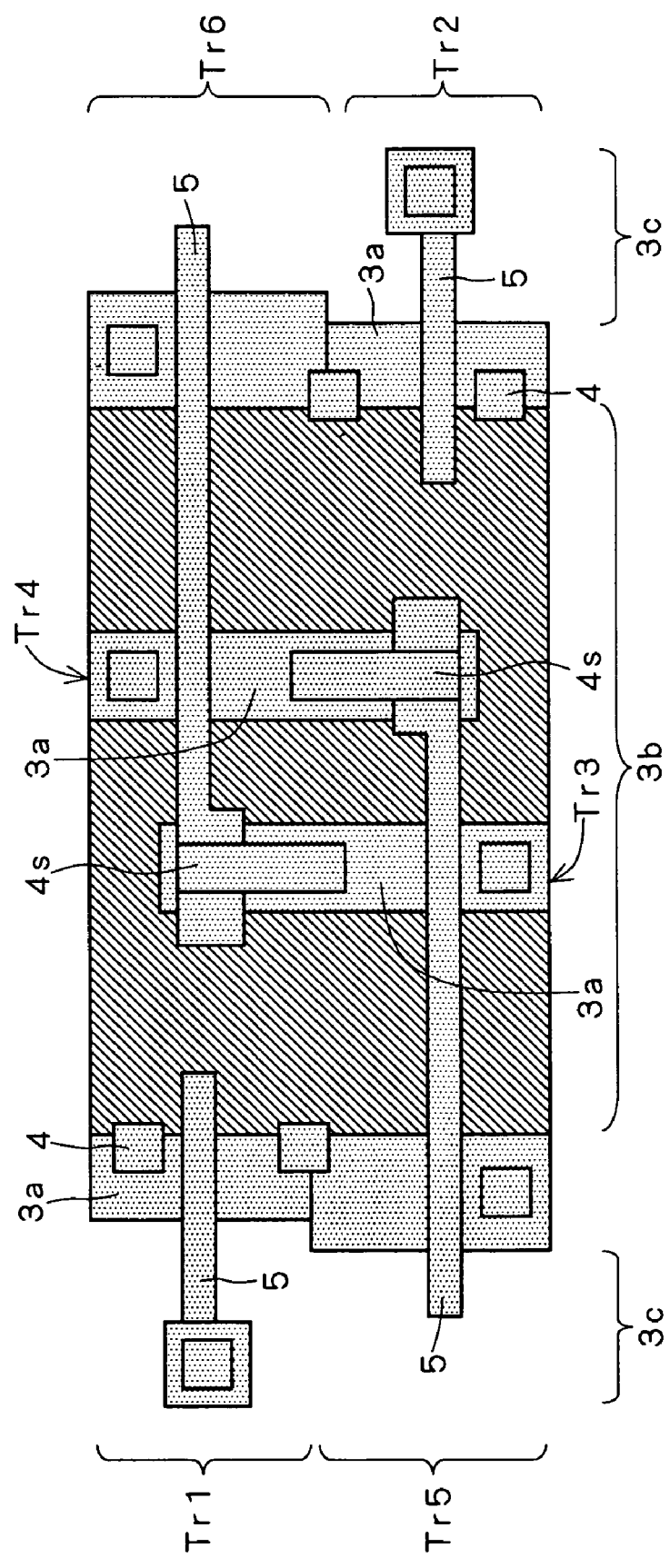
FIG. 26 is a plan view showing the configuration of an SRAM according to the fourth embodiment.

In this embodiment, another configuration where semiconductor devices according to the first embodiment are applied to an SRAM is shown. FIG. 26 is a plan view showing the configuration according to this embodiment. In this embodiment, the configuration shown in FIG. 7 is applied to access transistors Tr1 and Tr2.

Concretely speaking, complete separation insulating films 3b are formed on one side of the active regions 3a of the access transistors Tr1 and Tr2, while partial separation insulating films 3c are formed on the other side. Thus, contact portions 4 that are connected to the active regions of the access transistors Tr1 and Tr2 are provided toward the complete separation insulating film 3b sides, off the center of these active regions 3a.

Here, the bodies that are directly beneath the gate electrodes 5 of the access transistors Tr1 and Tr2 are connected to body regions 3d that exist beneath the partial separation insulating films 3c. In addition, the potential of these bodies is fixed.

In this embodiment, the complete separation insulating films 3b are formed on the two sides of the active regions 3a of the load transistors Tr3 and Tr4. Accordingly, the bodies that are directly beneath the gate electrodes 5 of the load transistors Tr3 and Tr4 have electrically a floating structure. In addition, the positions where shared contact portions 4s that are connected to these active regions 3a are arranged are not intentionally shifted off the center of active regions 3a.

In this embodiment, the configuration is provided in the above described manner; therefore, the same effects as those in the first embodiment can be gained for the access transistors Tr1 and Tr2.

Here, the periphery of the active regions 3a to which the shared contact portions 4s are connected is surrounded by the complete separation insulating films 3b. Accordingly, even in the case where the shared contact portions 4s are out of these active regions 3a, no such problem as the above described leak current is caused. Accordingly, strict precision becomes an unnecessary consideration in the process for providing the shared contact portions 4s; thus, simplification of the manufacturing process can be achieved.

Fifth Embodiment

Figure 27:
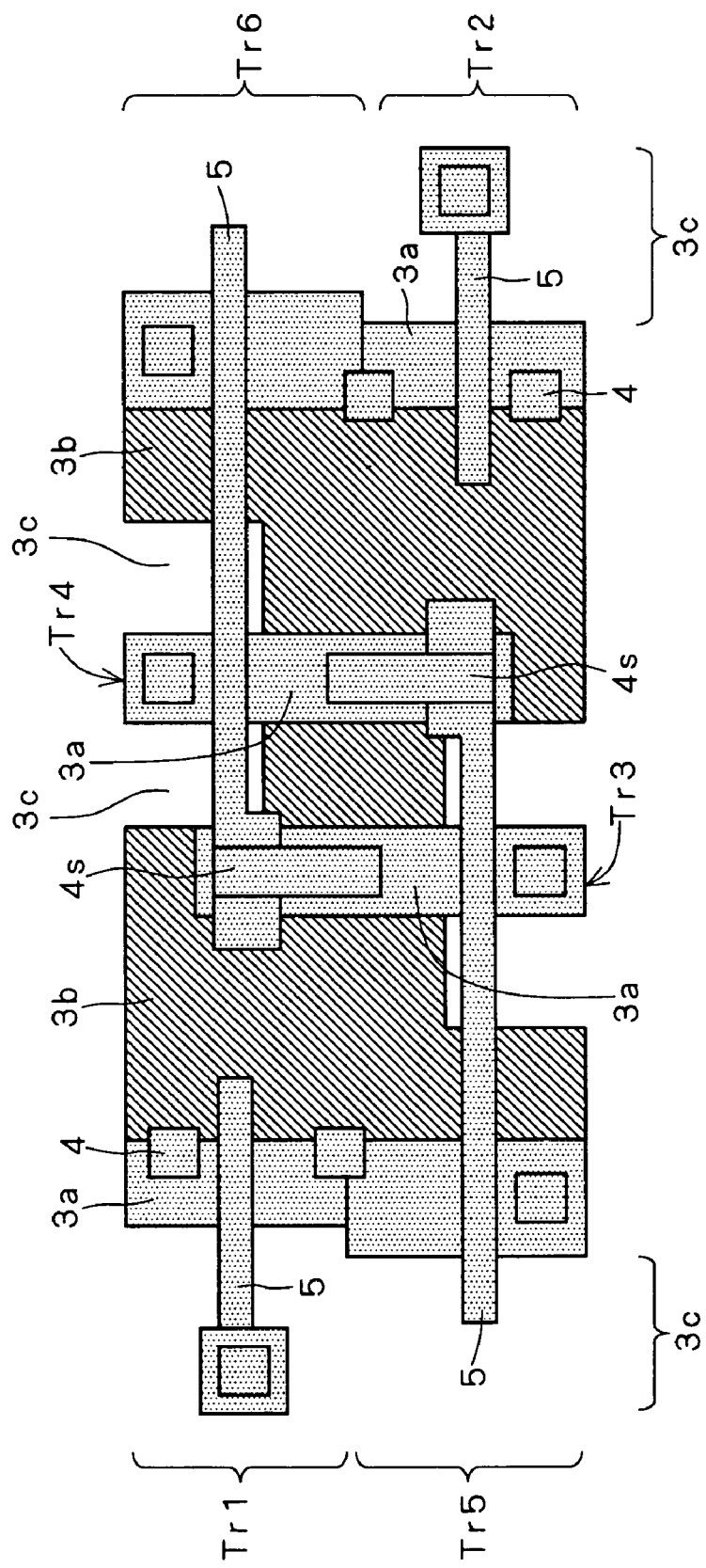
FIG. 27 is a plan view showing the configuration of an SRAM according to the fifth embodiment.

This embodiment is a modification of the SRAM according to the fourth embodiment. FIG. 27 shows the SRAM according to this embodiment.

In the SRAM according to the fourth embodiment, as shown in FIG. 26, complete separation insulating films 3b exist on both sides of two active regions (source regions and drain regions) 3a that form load transistors Tr3 and Tr4.

In the SRAM according to this embodiment, however, the complete separation insulating films 3b exist only on the two sides of one active region (drain region) 3a.

Concretely speaking, the active regions (drain regions) 3a are connected to the shared contacts 4s. In addition, as shown in FIG. 27, the complete separation insulating films 3a exist only on the two sides (one side and the other side, which is opposite to this side) of these regions of the connection portions of the active regions (major portions of the drain regions) 3a. The complete separation insulating films 3a are formed from the surface of the SOI layer 3 to the buried insulating film 2, as described above.

In addition, as shown in FIG. 27, partial separation insulating films 3c are formed on the two sides of active regions (portions of the source regions and the drain regions) 3a, excluding the portions that are connected to the shared contacts 4s.

Furthermore, the bodies that are directly beneath the gate electrodes 5 of the load transistors Tr3 and Tr4 are connected to the body regions 3d that exist beneath the partial separation insulating films 3c. However, the potential of these bodies is not fixed. That is, the bodies that are directly beneath the gate electrodes 5 of the load transistors Tr3 and Tr4 have electrically a floating structure.

The structures of the other parts are the same as those of the SRAM according to the fourth embodiment, and therefore, the descriptions thereof are here omitted.

The SRAM according to this embodiment is formed as described above, and therefore, has the same effects as the SRAM according to the fourth embodiment, in addition to the below described effects.

That is, the area of the bodies that are directly beneath the gate electrodes 5 of the load transistors Tr3 and Tr4 in the SRAM according to this embodiment becomes greater than that in the SRAM according to the fourth embodiment, as is clear from FIGS. 26 and 27. This is because the bodies that are directly beneath these gate electrodes 5 are connected to the body regions 3d that exist beneath the partial separation insulating films 3c in the SRAM according to this embodiment.

Accordingly, in the SRAM according to this embodiment, electrons that have been generated through impact ionization within the bodies that exist directly beneath the gate electrodes 5 of the load transistors Tr3 and Tr4 can be dispersed also into the body regions 3d.

Accordingly, the parasitic bipolar effects of these transistors Tr3 and Tr4 can be suppressed; therefore, these load transistors Tr3 and Tr4 can operate normally.

Sixth Embodiment

Figure 28:
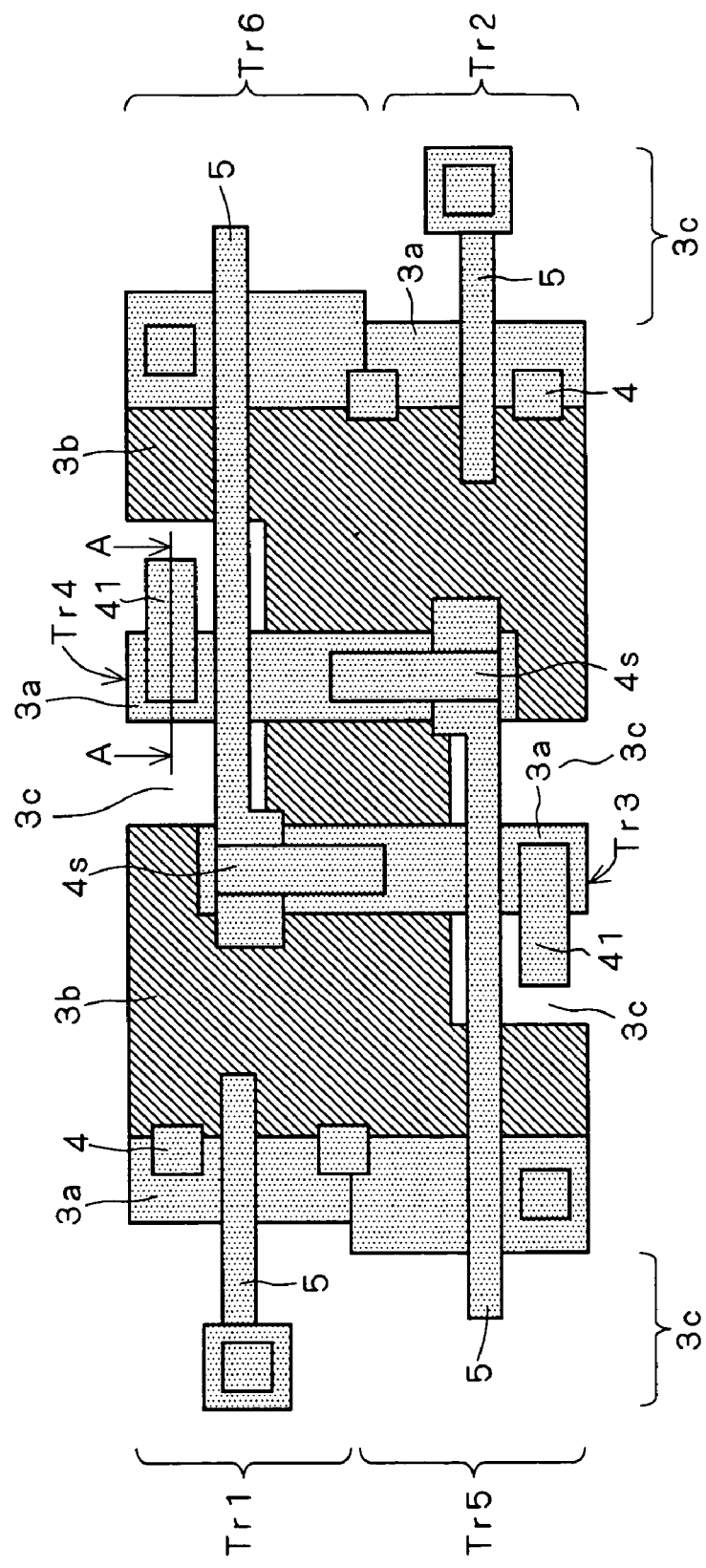
FIG. 28 is a plan view showing the configuration of an SRAM according to the sixth embodiment.
Figure 29:
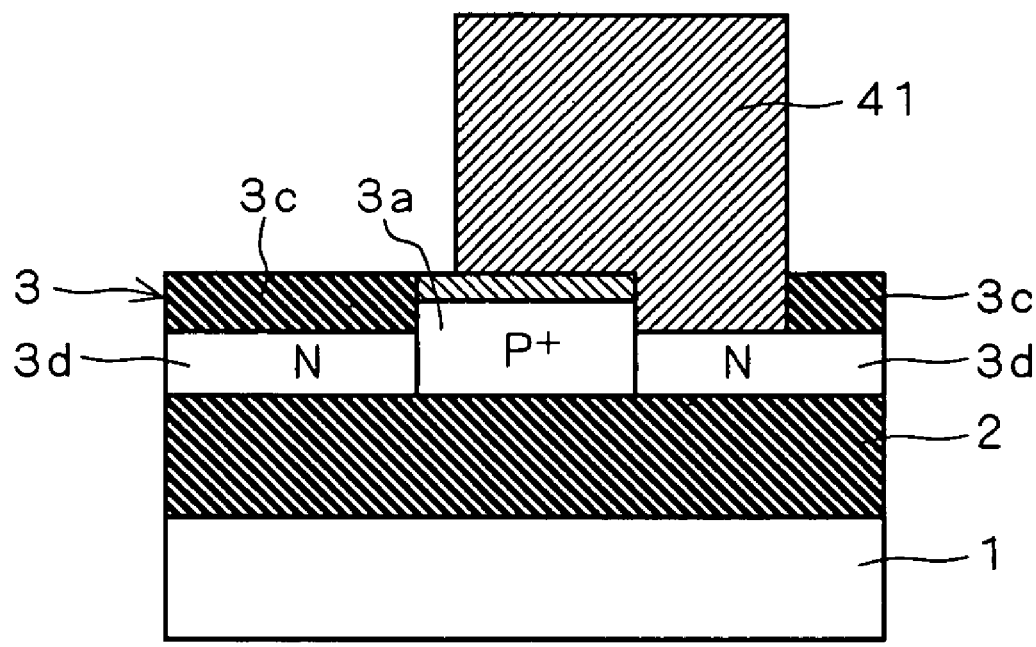
FIG. 29 is a cross-sectional view showing the configuration of the SRAM according to the sixth embodiment.

An SRAM according to this embodiment is a modification of the SRAM according to the fifth embodiment. FIG. 28 shows, in a plan view, the SRAM according to this embodiment. In addition, FIG. 29 shows a cross-sectional view along line A-A of FIG. 28.

In the SRAM according to the fifth embodiment, the bodies that are directly beneath the gate electrodes 5 of the load transistors Tr3 and Tr4 are in a floating state electrically.

In the SRAM according to this embodiment, however, active regions (source regions) 3a of the load transistors Tr3 and Tr4 which are surrounded by partial separation insulating films 3c and body regions 3d beneath the partial separation insulating films 3c are connected to a contact 41 for a power supply to which a predetermined fixed potential is supplied. In addition, body regions 3d are connected to the bodies that are directly beneath the gate electrodes 5 of the load transistors Tr3 and Tr4.

Accordingly, the potential of the bodies that are directly beneath the gate electrodes 5 of the load transistors Tr3 and Tr4 is fixed at a predetermined potential.

Here, as is clear from FIG. 29, the load transistors Tr3 and Tr4 are PMOSs.

The configurations of portions other than those described above are the same as those of the SRAM according to the fifth embodiment, and the descriptions thereof are here omitted.

The SRAM according to this embodiment is formed as described above, and therefore, the SRAM according to this embodiment has effects that are superior to those of the SRAM according to the fifth embodiment in the following points, in addition to the effects that are described in the fifth embodiment.

That is, the contact portion 41 for a power supply is also connected to the body regions 3d; therefore, electrons within the bodies that are directly beneath the gate electrodes 5 of the load transistors Tr3 and Tr4 can be shifted to the outside from this contact portion 41 for a power supply. As a result of this, the number of electrons which are generated through impact ionization within the bodies that are directly beneath these gate electrodes 5 can further be reduced.

Accordingly, the parasitic bipolar effects of the load transistors Tr3 and Tr4 can be suppressed. Therefore, precision in the operation of the load transistors Tr3 and Tr4 can further be ensured.

While the invention has been shown and described in detail, the foregoing description is in all aspects illustrative and not restrictive. It is therefore understood that numerous modifications and variations can be devised without departing from the scope of the invention.

What is claimed is:

1. An SRAM comprising:
an SOI substrate comprising a structure where a semiconductor support substrate, a buried insulating film and an SOI layer are layered in this order;
an access transistor which is formed in said SOI layer and has a first active region that is formed in a surface of said SOI layer;
a first insulating film that is formed beside one side of said first active region from the surface of said SOI layer to said buried insulating film;
a second insulating film that is formed beside the other side of said first active region, which is opposite to said one side, from the surface of said SOI layer to a predetermined depth that does not reach said buried insulating film;
a first conductor that is provided on said first active region toward a side where said first insulating film exists, off a center of said first active region in a plan view, said first conductor contacting said first insulating film;
a first load transistor which is formed in said SOI layer and has a second active region that is formed in the surface of said SOI layer;
a third insulating film that is formed beside one side of said second active region from the surface of said SOI layer to said buried insulating film;
a fourth insulating film that is formed beside the other side of said second active region, which is opposite to said one side, from the surface of said SOI layer to a predetermined depth that does not reach said buried insulating film; and
a second conductor that is provided on said second active region toward a side where said third insulating film exists, off a center of said second active region in a plan view.

2. The SRAM according to claim 1, wherein
said second conductor is connected to an upper surface and said one side of said second active region.

3. The SRAM according to claim 2, further comprising:
a second load transistor which is formed in said SOI layer and has a third active region that is formed in the surface of said SOI layer;
said first insulating film that is formed beside one side of said third active region from the surface of said SOI layer to said buried insulating film; and
a third conductor that is provided on said third active region toward a side where said first insulating film exists, off a center of said third active region in a plan view.

4. The SRAM according to claim 1, wherein
a width from said one side of said second active region to the other side is no greater than twice a diameter of said second conductor.

5. The SRAM further comprising:
an SOI substrate comprising a structure where a semiconductor support substrate, a buried insulating film and an SOI layer are layered in this order;
an access transistor which is formed in said SOI layer and has a first active region that is formed in a surface of said SOI layer;
a first insulating film that is formed beside one side of said first active region from the surface of said SOI layer to said buried insulating film;
a second insulating film that is formed beside the other side of said first active region, which is opposite to said one side, from the surface of said SOI layer to a predetermined depth that does not reach said buried insulating film;
a first conductor that is provided on said first active region toward a side where said first insulating film exists, off a center of said first active region in a plan view, said first conductor contacting said first insulating film, and said first conductor connected to an upper surface and said one side of said first active region;
a first load transistor which is formed in said SOI layer and has a second active region that is formed in the surface of said SOI layer;

a third insulating film that is formed beside one side of said second active region from the surface of said SOI layer to said buried insulating film;
a fourth insulating film that is formed beside the other side of said second active region, which is opposite to said one side, from the surface of said SOI layer to a predetermined depth that does not reach said buried insulating film; and
a second conductor that is provided on said second active region toward a side where said third insulating film exists, off a center of said second active region in a plan view.

6. The SRAM according to claim 5, wherein said second conductor is connected to an upper surface and said one side of said second active region.

7. The SRAM according to claim 6, wherein a width from said one side of said second active region to the other side is no greater than twice a diameter of said second conductor.

* * * * *